US009129961B2

(12) United States Patent
Ahn et al.

(10) Patent No.: US 9,129,961 B2
(45) Date of Patent: Sep. 8, 2015

(54) GALLIUM LATHANIDE OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

(\*) Notice: Subject to any disclaimer, the term of this patent is extended or adjusted under 35 U.S.C. 154(b) by 0 days.

(21) Appl. No.: 13/175,551

(22) Filed: Jul. 1, 2011

(65) Prior Publication Data

US 2011/0260215 A1      Oct. 27, 2011

Related U.S. Application Data

(62) Division of application No. 11/329,025, filed on Jan. 10, 2006, now Pat. No. 7,972,974.

(51) Int. Cl.
| | |
|---|---|
| *H01L 29/51* | (2006.01) |
| *H01L 21/02* | (2006.01) |
| *H01L 21/314* | (2006.01) |
| *C23C 16/40* | (2006.01) |
| *C23C 16/455* | (2006.01) |
| *H01L 21/28* | (2006.01) |
| *H01L 21/316* | (2006.01) |
| *H01L 49/02* | (2006.01) |
| *H01L 29/10* | (2006.01) |
| *H01L 29/788* | (2006.01) |
| *H01L 21/8238* | (2006.01) |

(52) U.S. Cl.
CPC ............. *H01L 29/513* (2013.01); *C23C 16/40* (2013.01); *C23C 16/45531* (2013.01); *H01L 21/02192* (2013.01); *H01L 21/28194* (2013.01); *H01L 21/3141* (2013.01); *H01L 21/3142* (2013.01); *H01L 21/31604* (2013.01); *H01L 28/40* (2013.01); *H01L 29/1033* (2013.01); *H01L 29/517* (2013.01); *H01L 29/7881* (2013.01); *H01L 21/823857* (2013.01)

(58) Field of Classification Search
CPC ...................... H01L 21/02192; H01L 21/3142
See application file for complete search history.

(56) References Cited

U.S. PATENT DOCUMENTS

| | | |
|---|---|---|
| 4,645,622 A | 2/1987 | Kock |
| 5,057,447 A | 10/1991 | Paterson |
| 5,100,825 A | 3/1992 | Fazan et al. |
| 5,192,871 A | 3/1993 | Ramakrishnan et al. |
| 5,712,180 A | 1/1998 | Guterman et al. |
| 5,749,937 A | 5/1998 | Detering et al. |

(Continued)

FOREIGN PATENT DOCUMENTS

WO      WO-0197257 A2     12/2001

OTHER PUBLICATIONS

Aarik, J., et al., "Atomic layer growth of epitaxial TiO/sub 2/ thin films from TiCl/sub 4/ and H/sub 2/O on alpha-Al/sub 2/O/sub 3/ substrates", Journal of Crystal Growth, 242(1-2), (2002), 189-198.

(Continued)

*Primary Examiner* — Daniel Luke
(74) *Attorney, Agent, or Firm* — Schwegman Lundberg & Woessner, P.A.

(57) ABSTRACT

Electronic apparatus and methods of forming the electronic apparatus include a gallium lanthanide oxide film for use in a variety of electronic systems. The gallium lanthanide oxide film may be structured as one or more monolayers. The gallium lanthanide oxide film may be formed using atomic layer deposition.

27 Claims, 3 Drawing Sheets

(56) References Cited

U.S. PATENT DOCUMENTS

| | | | |
|---|---|---|---|
| 5,910,916 A | 6/1999 | Akaogi et al. | |
| 5,994,240 A | 11/1999 | Thakur | |
| 5,998,264 A | 12/1999 | Wu | |
| 6,020,024 A | 2/2000 | Maiti et al. | |
| 6,020,243 A | 2/2000 | Wallace et al. | |
| 6,110,544 A | 8/2000 | Yang et al. | |
| 6,144,584 A | 11/2000 | Kunori et al. | |
| 6,150,724 A | 11/2000 | Wenzel et al. | |
| 6,225,163 B1 | 5/2001 | Bergemont | |
| 6,294,420 B1 | 9/2001 | Tsu et al. | |
| 6,297,539 B1 | 10/2001 | Ma et al. | |
| 6,313,486 B1 * | 11/2001 | Kencke et al. | 257/192 |
| 6,352,591 B1 | 3/2002 | Yieh et al. | |
| 6,417,537 B1 | 7/2002 | Yang et al. | |
| 6,441,421 B1 | 8/2002 | Clevenger et al. | |
| 6,455,330 B1 | 9/2002 | Yao et al. | |
| 6,495,436 B2 | 12/2002 | Ahn et al. | |
| 6,495,437 B1 | 12/2002 | Yu | |
| 6,500,499 B1 | 12/2002 | Senzaki et al. | |
| 6,511,873 B2 | 1/2003 | Ballantine et al. | |
| 6,514,828 B2 | 2/2003 | Ahn et al. | |
| 6,531,354 B2 | 3/2003 | Maria et al. | |
| 6,534,420 B2 | 3/2003 | Ahn et al. | |
| 6,542,229 B1 | 4/2003 | Kalal et al. | |
| 6,552,388 B2 | 4/2003 | Wilk et al. | |
| 6,562,491 B1 | 5/2003 | Jeon | |
| 6,563,160 B2 | 5/2003 | Clevenger et al. | |
| 6,608,378 B2 | 8/2003 | Ahn et al. | |
| 6,617,639 B1 * | 9/2003 | Wang et al. | 257/324 |
| 6,638,810 B2 | 10/2003 | Bakli et al. | |
| 6,656,764 B1 | 12/2003 | Wang et al. | |
| 6,660,578 B1 | 12/2003 | Karlsson et al. | |
| 6,660,660 B2 | 12/2003 | Haukka et al. | |
| 6,661,058 B2 | 12/2003 | Ahn et al. | |
| 6,673,701 B1 | 1/2004 | Marsh et al. | |
| 6,700,171 B2 | 3/2004 | Landheer et al. | |
| 6,730,163 B2 | 5/2004 | Vaartstra | |
| 6,730,164 B2 | 5/2004 | Vaartstra et al. | |
| 6,746,930 B2 | 6/2004 | Yang et al. | |
| 6,750,126 B1 | 6/2004 | Visokay et al. | |
| 6,753,567 B2 | 6/2004 | Maria et al. | |
| 6,767,795 B2 | 7/2004 | Ahn et al. | |
| 6,770,923 B2 | 8/2004 | Nguyen et al. | |
| 6,784,049 B2 | 8/2004 | Vaartstra | |
| 6,784,101 B1 | 8/2004 | Yu et al. | |
| 6,787,413 B2 | 9/2004 | Ahn | |
| 6,787,421 B2 | 9/2004 | Gilmer et al. | |
| 6,790,755 B2 | 9/2004 | Jeon | |
| 6,794,284 B2 | 9/2004 | Vaartstra | |
| 6,797,561 B2 | 9/2004 | Ko et al. | |
| 6,797,572 B1 * | 9/2004 | Jeon et al. | 438/287 |
| 6,806,211 B2 | 10/2004 | Shinriki et al. | |
| 6,844,203 B2 | 1/2005 | Ahn et al. | |
| 6,844,604 B2 | 1/2005 | Lee et al. | |
| 6,852,645 B2 | 2/2005 | Colombo et al. | |
| 6,863,725 B2 | 3/2005 | Vaartstra et al. | |
| 6,864,191 B2 | 3/2005 | Yoon | |
| 6,893,984 B2 | 5/2005 | Ahn et al. | |
| 6,900,122 B2 | 5/2005 | Ahn et al. | |
| 6,921,702 B2 | 7/2005 | Ahn et al. | |
| 6,949,433 B1 | 9/2005 | Hidehiko et al. | |
| 6,949,787 B2 | 9/2005 | Snyder et al. | |
| 6,953,730 B2 | 10/2005 | Ahn et al. | |
| 6,958,300 B2 | 10/2005 | Vaartstra et al. | |
| 6,958,302 B2 | 10/2005 | Ahn et al. | |
| 6,960,538 B2 | 11/2005 | Ahn et al. | |
| 6,967,159 B2 | 11/2005 | Vaartstra | |
| 6,979,855 B2 | 12/2005 | Ahn et al. | |
| 6,984,591 B1 | 1/2006 | Buchanan et al. | |
| 6,984,592 B2 | 1/2006 | Vaartstra | |
| 6,989,565 B1 | 1/2006 | Aronowitz et al. | |
| 6,989,573 B2 | 1/2006 | Ahn et al. | |
| 6,995,081 B2 | 2/2006 | Vaartstra | |
| 7,026,694 B2 | 4/2006 | Ahn et al. | |
| 7,030,042 B2 | 4/2006 | Vaartstra et al. | |
| 7,037,862 B2 | 5/2006 | Ahn et al. | |
| 7,041,609 B2 | 5/2006 | Vaartstra | |
| 7,045,430 B2 | 5/2006 | Ahn et al. | |
| 7,049,192 B2 | 5/2006 | Ahn et al. | |
| 7,057,244 B2 | 6/2006 | Andreoni et al. | |
| 7,068,544 B2 | 6/2006 | Forbes et al. | |
| 7,077,902 B2 | 7/2006 | Vaartstra | |
| 7,081,421 B2 | 7/2006 | Ahn et al. | |
| 7,084,078 B2 | 8/2006 | Ahn et al. | |
| 7,087,481 B2 | 8/2006 | Vaartstra et al. | |
| 7,101,813 B2 | 9/2006 | Ahn et al. | |
| 7,109,079 B2 | 9/2006 | Schaeffer, III et al. | |
| 7,112,485 B2 | 9/2006 | Vaartstra | |
| 7,115,166 B2 | 10/2006 | Vaartstra et al. | |
| 7,115,528 B2 | 10/2006 | Vaartstra et al. | |
| 7,122,464 B2 | 10/2006 | Vaartstra | |
| 7,125,815 B2 | 10/2006 | Vaartstra | |
| 7,135,369 B2 | 11/2006 | Ahn et al. | |
| 7,135,421 B2 | 11/2006 | Ahn et al. | |
| 7,138,681 B2 | 11/2006 | Forbes et al. | |
| 7,151,294 B2 | 12/2006 | Forbes et al. | |
| 7,157,769 B2 | 1/2007 | Forbes | |
| 7,160,577 B2 | 1/2007 | Ahn et al. | |
| 7,164,168 B2 | 1/2007 | Forbes et al. | |
| 7,190,020 B2 | 3/2007 | Forbes et al. | |
| 7,195,999 B2 | 3/2007 | Forbes et al. | |
| 7,196,007 B2 | 3/2007 | Vaartstra | |
| 7,199,023 B2 | 4/2007 | Ahn et al. | |
| 7,221,018 B2 | 5/2007 | Forbes | |
| 7,235,501 B2 | 6/2007 | Ahn et al. | |
| 7,250,367 B2 | 7/2007 | Vaartstra et al. | |
| 7,253,122 B2 | 8/2007 | Vaartstra | |
| 7,271,077 B2 | 9/2007 | Vaartstra et al. | |
| 7,294,556 B2 | 11/2007 | Vaartstra | |
| 7,300,870 B2 | 11/2007 | Vaartstra | |
| 7,323,423 B2 | 1/2008 | Brask et al. | |
| 7,323,424 B2 | 1/2008 | Ahn et al. | |
| 7,332,442 B2 | 2/2008 | Vaartstra et al. | |
| 7,339,228 B2 | 3/2008 | Forbes et al. | |
| 7,365,027 B2 | 4/2008 | Ahn et al. | |
| 7,368,402 B2 | 5/2008 | Vaartstra | |
| 7,369,435 B2 | 5/2008 | Forbes | |
| 7,374,617 B2 | 5/2008 | Vaartstra | |
| 7,388,246 B2 | 6/2008 | Ahn et al. | |
| 7,388,251 B2 | 6/2008 | Forbes et al. | |
| 7,390,756 B2 | 6/2008 | Ahn et al. | |
| 7,399,666 B2 | 7/2008 | Ahn et al. | |
| 7,402,876 B2 | 7/2008 | Ahn et al. | |
| 7,405,454 B2 | 7/2008 | Ahn et al. | |
| 7,410,910 B2 | 8/2008 | Ahn et al. | |
| 7,410,917 B2 | 8/2008 | Ahn et al. | |
| 7,410,918 B2 | 8/2008 | Vaartstra | |
| 7,411,237 B2 | 8/2008 | Ahn et al. | |
| 7,427,536 B2 | 9/2008 | Forbes et al. | |
| 7,473,956 B2 | 1/2009 | Eldridge et al. | |
| 7,479,428 B2 | 1/2009 | Forbes | |
| 7,494,939 B2 | 2/2009 | Ahn et al. | |
| 7,508,025 B2 | 3/2009 | Eldridge et al. | |
| 7,508,648 B2 | 3/2009 | Ahn et al. | |
| 7,510,983 B2 | 3/2009 | Ahn et al. | |
| 7,518,246 B2 | 4/2009 | Ahn et al. | |
| 7,531,869 B2 | 5/2009 | Ahn et al. | |
| 7,544,596 B2 | 6/2009 | Ahn et al. | |
| 7,545,674 B2 | 6/2009 | Forbes et al. | |
| 7,550,341 B2 | 6/2009 | Forbes et al. | |
| 7,554,161 B2 | 6/2009 | Ahn et al. | |
| 7,560,395 B2 | 7/2009 | Ahn | |
| 7,572,695 B2 | 8/2009 | Ahn et al. | |
| 7,588,988 B2 | 9/2009 | Ahn et al. | |
| 7,592,251 B2 | 9/2009 | Ahn et al. | |
| 7,601,649 B2 | 10/2009 | Ahn et al. | |
| 7,602,030 B2 | 10/2009 | Ahn et al. | |
| 7,605,030 B2 | 10/2009 | Forbes et al. | |
| 7,611,959 B2 | 11/2009 | Ahn et al. | |
| 7,615,438 B2 | 11/2009 | Ahn et al. | |
| 7,625,794 B2 | 12/2009 | Ahn et al. | |
| 7,662,729 B2 | 2/2010 | Ahn et al. | |
| 7,670,646 B2 | 3/2010 | Ahn et al. | |
| 7,687,409 B2 | 3/2010 | Ahn et al. | |

(56) References Cited

U.S. PATENT DOCUMENTS

| | | |
|---|---|---|
| 7,700,989 B2 | 4/2010 | Ahn et al. |
| 7,719,065 B2 | 5/2010 | Ahn et al. |
| 7,727,905 B2 | 6/2010 | Ahn et al. |
| 7,776,762 B2 | 8/2010 | Ahn et al. |
| 7,863,667 B2 | 1/2011 | Ahn et al. |
| 7,867,919 B2 | 1/2011 | Ahn |
| 7,972,974 B2 | 7/2011 | Ahn et al. |
| 8,742,515 B2 | 6/2014 | Ahn et al. |
| 8,765,616 B2 | 7/2014 | Ahn et al. |
| 8,895,442 B2 | 11/2014 | Ahn et al. |
| 8,907,486 B2 | 12/2014 | Ahn et al. |
| 8,933,449 B2 | 1/2015 | Ahn et al. |
| 2001/0015441 A1 | 8/2001 | Kawasaki et al. |
| 2001/0031332 A1 | 10/2001 | Tominaga et al. |
| 2001/0032995 A1 | 10/2001 | Maria et al. |
| 2001/0054598 A1 | 12/2001 | Kashiwaya et al. |
| 2002/0001971 A1 | 1/2002 | Cho |
| 2002/0089023 A1 | 7/2002 | Yu et al. |
| 2002/0121665 A1 | 9/2002 | Kawasaki et al. |
| 2002/0135048 A1 | 9/2002 | Ahn et al. |
| 2002/0146874 A1 | 10/2002 | Kawasaki et al. |
| 2002/0192974 A1 | 12/2002 | Ahn et al. |
| 2002/0192975 A1 | 12/2002 | Ahn et al. |
| 2003/0008235 A1 | 1/2003 | Inoue et al. |
| 2003/0016619 A1 | 1/2003 | Judge et al. |
| 2003/0032238 A1 | 2/2003 | Kim et al. |
| 2003/0040196 A1 | 2/2003 | Lim et al. |
| 2003/0043637 A1 | 3/2003 | Forbes et al. |
| 2003/0045078 A1 | 3/2003 | Ahn et al. |
| 2003/0049942 A1* | 3/2003 | Haukka et al. ............... 438/778 |
| 2003/0060146 A1 | 3/2003 | Kashiwaya et al. |
| 2003/0092213 A1 | 5/2003 | Yamazaki et al. |
| 2003/0111678 A1 | 6/2003 | Colombo et al. |
| 2003/0137019 A1 | 7/2003 | Maria et al. |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0213987 A1 | 11/2003 | Basceri |
| 2003/0227033 A1 | 12/2003 | Ahn et al. |
| 2003/0228747 A1 | 12/2003 | Ahn et al. |
| 2003/0235134 A1 | 12/2003 | Inoue et al. |
| 2004/0027966 A1 | 2/2004 | Inoue et al. |
| 2004/0032812 A1 | 2/2004 | Inoue et al. |
| 2004/0040494 A1 | 3/2004 | Vaartstra et al. |
| 2004/0040501 A1 | 3/2004 | Vaartstra |
| 2004/0041192 A1 | 3/2004 | Baker |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043578 A1 | 3/2004 | Marsh |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0077177 A1 | 4/2004 | Andreoni et al. |
| 2004/0092061 A1 | 5/2004 | Kawasaki et al. |
| 2004/0092073 A1 | 5/2004 | Cabral, Jr. et al. |
| 2004/0094801 A1 | 5/2004 | Liang et al. |
| 2004/0097022 A1 | 5/2004 | Werkhoven et al. |
| 2004/0104439 A1 | 6/2004 | Haukka et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0140470 A1 | 7/2004 | Kawasaki et al. |
| 2004/0144980 A1 | 7/2004 | Ahn et al. |
| 2004/0146805 A1 | 7/2004 | Kato et al. |
| 2004/0152254 A1 | 8/2004 | Vaartstra et al. |
| 2004/0157158 A1 | 8/2004 | Kakiuchi et al. |
| 2004/0161883 A1 | 8/2004 | Colombo et al. |
| 2004/0164357 A1 | 8/2004 | Ahn et al. |
| 2004/0174804 A1 | 9/2004 | Kakiuchi et al. |
| 2004/0175882 A1 | 9/2004 | Ahn et al. |
| 2004/0180171 A1 | 9/2004 | Takasaki et al. |
| 2004/0183108 A1 | 9/2004 | Ahn et al. |
| 2004/0185654 A1 | 9/2004 | Ahn et al. |
| 2004/0187968 A1 | 9/2004 | Vaartstra |
| 2004/0188778 A1 | 9/2004 | Aoyama |
| 2004/0190435 A1 | 9/2004 | Hosoda et al. |
| 2004/0191462 A1 | 9/2004 | Hosoda et al. |
| 2004/0191685 A1 | 9/2004 | Kakiuchi et al. |
| 2004/0191687 A1 | 9/2004 | Fukuzawa et al. |
| 2004/0191689 A1 | 9/2004 | Shingai et al. |
| 2004/0197946 A1 | 10/2004 | Vaartstra et al. |
| 2004/0208105 A1 | 10/2004 | Shingai et al. |
| 2004/0213124 A1 | 10/2004 | Shingai et al. |
| 2004/0214399 A1 | 10/2004 | Ahn et al. |
| 2004/0219746 A1 | 11/2004 | Vaartstra et al. |
| 2004/0222476 A1 | 11/2004 | Ahn et al. |
| 2004/0238904 A1 | 12/2004 | Colombo et al. |
| 2004/0241581 A1 | 12/2004 | Kakiuchi et al. |
| 2004/0248387 A1 | 12/2004 | Kawasaki et al. |
| 2004/0262700 A1 | 12/2004 | Ahn et al. |
| 2004/0264236 A1 | 12/2004 | Chae et al. |
| 2004/0266117 A1 | 12/2004 | Hwang |
| 2005/0009266 A1 | 1/2005 | Vaartstra |
| 2005/0009368 A1 | 1/2005 | Vaartstra |
| 2005/0009370 A1 | 1/2005 | Ahn |
| 2005/0018590 A1 | 1/2005 | Inoue et al. |
| 2005/0018591 A1 | 1/2005 | Inoue et al. |
| 2005/0018592 A1 | 1/2005 | Inoue et al. |
| 2005/0019978 A1 | 1/2005 | Vaartstra et al. |
| 2005/0020017 A1 | 1/2005 | Ahn et al. |
| 2005/0023594 A1 | 2/2005 | Ahn et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0032360 A1 | 2/2005 | Vaartstra |
| 2005/0037563 A1 | 2/2005 | Ahn |
| 2005/0047301 A1 | 3/2005 | Inoue et al. |
| 2005/0047302 A1 | 3/2005 | Inoue et al. |
| 2005/0047303 A1 | 3/2005 | Inoue et al. |
| 2005/0047304 A1 | 3/2005 | Inoue et al. |
| 2005/0047305 A1 | 3/2005 | Inoue et al. |
| 2005/0047306 A1 | 3/2005 | Inoue et al. |
| 2005/0048249 A1 | 3/2005 | Inoue et al. |
| 2005/0054149 A1 | 3/2005 | Xiang et al. |
| 2005/0054165 A1 | 3/2005 | Ahn et al. |
| 2005/0059198 A1 | 3/2005 | Visokay et al. |
| 2005/0070062 A1 | 3/2005 | Visokay et al. |
| 2005/0077519 A1 | 4/2005 | Ahn et al. |
| 2005/0079696 A1 | 4/2005 | Colombo |
| 2005/0085092 A1 | 4/2005 | Adetutu et al. |
| 2005/0106797 A1 | 5/2005 | Colombo |
| 2005/0112499 A1 | 5/2005 | Nakai et al. |
| 2005/0124171 A1 | 6/2005 | Vaartstra |
| 2005/0124175 A1 | 6/2005 | Ahn et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0136689 A9 | 6/2005 | Vaartstra |
| 2005/0141281 A1 | 6/2005 | Jung |
| 2005/0142324 A1 | 6/2005 | Hayashida et al. |
| 2005/0145957 A1 | 7/2005 | Ahn et al. |
| 2005/0151184 A1 | 7/2005 | Lee et al. |
| 2005/0156256 A1 | 7/2005 | Kim et al. |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0170208 A1 | 8/2005 | Yatsunami et al. |
| 2005/0173755 A1 | 8/2005 | Forbes |

(56) References Cited

U.S. PATENT DOCUMENTS

| | | |
|---|---|---|
| 2005/0181607 A1 | 8/2005 | Aoyama |
| 2005/0202659 A1 | 9/2005 | Li et al. |
| 2005/0207308 A1 | 9/2005 | Kobayashi et al. |
| 2005/0212119 A1 | 9/2005 | Shero et al. |
| 2005/0215015 A1 | 9/2005 | Ahn et al. |
| 2005/0217722 A1 | 10/2005 | Komatsu et al. |
| 2005/0218462 A1 | 10/2005 | Ahn et al. |
| 2005/0221006 A1 | 10/2005 | Vaartstra |
| 2005/0221623 A1 | 10/2005 | Passlack et al. |
| 2005/0227442 A1 | 10/2005 | Ahn et al. |
| 2005/0233247 A1 | 10/2005 | Hosoda et al. |
| 2005/0243677 A1 | 11/2005 | Kobayashi et al. |
| 2005/0260347 A1 | 11/2005 | Narwankar et al. |
| 2005/0260357 A1 | 11/2005 | Olsen et al. |
| 2005/0263756 A1 | 12/2005 | Yatsunami et al. |
| 2005/0270963 A1 | 12/2005 | Mishima et al. |
| 2005/0271812 A1 | 12/2005 | Myo et al. |
| 2005/0271813 A1 | 12/2005 | Kher et al. |
| 2005/0274978 A1 * | 12/2005 | Antoniadis et al. ............ 257/192 |
| 2005/0275011 A1 | 12/2005 | Forbes |
| 2005/0277243 A1 | 12/2005 | Forbes |
| 2005/0282329 A1 | 12/2005 | Li |
| 2005/0285225 A1 | 12/2005 | Ahn et al. |
| 2005/0285226 A1 | 12/2005 | Lee |
| 2005/0287804 A1 | 12/2005 | Vaartstra |
| 2005/0287819 A1 | 12/2005 | Vaartstra et al. |
| 2006/0003529 A1 | 1/2006 | Baker |
| 2006/0019033 A1 | 1/2006 | Muthukrishnan et al. |
| 2006/0019453 A1 | 1/2006 | Forbes |
| 2006/0024975 A1 | 2/2006 | Ahn et al. |
| 2006/0027882 A1 | 2/2006 | Mokhlesi |
| 2006/0033144 A1 | 2/2006 | Forbes et al. |
| 2006/0043504 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0081895 A1 | 4/2006 | Lee et al. |
| 2006/0125026 A1 | 6/2006 | Li et al. |
| 2006/0125030 A1 | 6/2006 | Ahn et al. |
| 2006/0128168 A1 | 6/2006 | Ahn et al. |
| 2006/0145241 A1 | 7/2006 | Forbes et al. |
| 2006/0148180 A1 | 7/2006 | Ahn et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0180876 A1 | 8/2006 | Forbes et al. |
| 2006/0183271 A1 | 8/2006 | Forbes et al. |
| 2006/0183272 A1 | 8/2006 | Ahn et al. |
| 2006/0186458 A1 | 8/2006 | Forbes et al. |
| 2006/0189154 A1 | 8/2006 | Ahn et al. |
| 2006/0208309 A1 | 9/2006 | Forbes et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0244082 A1 | 11/2006 | Ahn et al. |
| 2006/0244100 A1 | 11/2006 | Ahn et al. |
| 2006/0245255 A1 | 11/2006 | Forbes et al. |
| 2006/0252244 A1 | 11/2006 | Vaartstra et al. |
| 2006/0252279 A1 | 11/2006 | Vaartstra |
| 2006/0258175 A1 | 11/2006 | Vaartstra et al. |
| 2006/0261389 A1 | 11/2006 | Vaartstra |
| 2006/0264066 A1 | 11/2006 | Bartholomew et al. |
| 2006/0270147 A1 | 11/2006 | Ahn et al. |
| 2006/0281330 A1 | 12/2006 | Ahn et al. |
| 2006/0292788 A1 | 12/2006 | Vaartstra |
| 2007/0004224 A1 * | 1/2007 | Currie ............................ 438/778 |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0048989 A1 | 3/2007 | Ahn et al. |
| 2007/0049051 A1 | 3/2007 | Ahn et al. |
| 2007/0049054 A1 | 3/2007 | Ahn et al. |
| 2007/0090440 A1 | 4/2007 | Ahn et al. |
| 2007/0138565 A1 * | 6/2007 | Datta et al. .................... 257/369 |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0112228 A1 | 5/2008 | Forbes et al. |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0220618 A1 | 9/2008 | Ahn et al. |
| 2008/0274625 A1 | 11/2008 | Ahn et al. |
| 2009/0032910 A1 | 2/2009 | Ahn et al. |
| 2009/0152620 A1 | 6/2009 | Ahn et al. |
| 2009/0155976 A1 | 6/2009 | Ahn et al. |
| 2009/0191676 A1 | 7/2009 | Forbes |
| 2009/0218611 A1 | 9/2009 | Forbes et al. |
| 2010/0006918 A1 | 1/2010 | Ahn et al. |
| 2010/0029054 A1 | 2/2010 | Ahn et al. |
| 2010/0035749 A1 | 2/2010 | Choi et al. |
| 2010/0044771 A1 | 2/2010 | Ahn et al. |
| 2010/0052033 A1 | 3/2010 | Ahn et al. |
| 2010/0176442 A1 | 7/2010 | Ahn et al. |
| 2010/0224944 A1 | 9/2010 | Ahn et al. |
| 2010/0301406 A1 | 12/2010 | Ahn et al. |

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, Kie Y, "Hafnium Tantalum Titanium Oxide Films", U.S. Appl. No. 11/297,741, filed Dec. 8, 2005, 05-0782.

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films as Gate Dielectrics", U.S. Appl. No. 11/010,766, filed Dec. 13, 2004, 04-0997.

Ahn, Kie Y, "Iridium / Zirconium Oxide Structure", U.S. Appl. No. 11/152,759, filed Jun. 14, 2005, 05-0201.

Ahn, Kie Y, et al., "Lanthanide Yttrium Aluminum Oxide Dielectric Films", U.S. Appl. No. 11/297,567, filed Dec. 8, 2005, 05-0711.

Ahn, Kie Y, "Lanthanum Aluminum Oxynitride Dielectric Films", U.S. Appl. No. 11/216,474, filed Aug. 31, 2005, 05-0565.

Ahn, Kie Y, et al., "Magnesium Titanium Oxide Films", U.S. Appl. No. 11/189,075, filed Jul. 25, 2005, 05-0381.

Ahn, Kie Y, "Magnesium-Doped Zinc Oxide Structures and Methods", U.S. Appl. No. 11/706,820, filed Feb. 13, 2007 (Client ref No. 06-0979).

Ahn, Kie Y, "Molybdenum-Doped Indium Oxide Structures and Methods", U.S. Appl. No. 11/706,944, filed Feb. 13, 2007.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004 (Client Ref. No. 04-0207).

(56) References Cited

OTHER PUBLICATIONS

Ahn, Kie Y., et al., "Tungsten-Doped Indium Oxide Structures and Methods", U.S. Appl. No. 11/706,498, filed Feb. 13, 2007 (Client ref No. 06-06-0912).

Ahn, Kie Y., "Zirconium-Doped Gadolinium Oxide Films", U.S. Appl. No. 11/215,578, filed Aug. 29, 2005, 05-0597.

Ahn, Kie Y., et al., "Zirconium-Doped Zinc Oxide Structures and Methods", U.S. Appl. No. 11/707,173, filed Feb. 13, 2007 (Client ref No. 06-0853).

Boutros, K. S., et al., "High quality InGaN films by atomic layer epitaxy", Appl. Phys. Lett., 67(13), (Sep. 25, 1995), 1856-1858.

Campbell, Stephen A., et al., "MOSFET Transistors Fabricated with High Permittivity TiO2 Dielectrics", IEEE Transactions on Electron Devices, vol. 44, No. 1, (Jan. 1997), 104-109.

Chin, Albert, et al., "Device and reliability of high-K Al O gate dielectric. with good mobility and low D", 1999 Symposium on VLSI Technology Digest of Technical Papers, (1999), 135-136.

Cho, H., et al., "Novel nitrogen profile engineering for improved TaN/HfO2/Si MOSFET performance", International Electron Devices Meeting, 2001. IEDM Technical Digest., (2001), 655-658.

Clark-Phelps, R. B, et al., "Engineered Tantalum Aluminate and Hafnium Aluminate ALD Films for Ultrathin Dielectric Films with Improved Electric and Thermal Properties", Gate Stack and Silicide Issues in Silicon Processing II. Symposium (Materials Research Society Symposium Proceedings vol. 670), (Apr. 17, 2001), pp. K2201-K2206.

Degrave, R, "Temperature Acceleration of oxide breakdown and its impact on ultra-thin gate oxide reliaility", 1999 Symposium on VLSI Technology Digest of Technical Papers, (1999), 59-60.

Endo, Kazuhiko, "Metal Organic Atomic Layer Deposition of High-k Gate Dielectrics, Using Plasma Oxidation", Japanese Journal of Applied Physics, 42, (2003). L685-L687.

Forbes, "Hafnium Tantalum Oxynitride High-K Dielectric and Metal Gates", U.S. Appl. No. 11/515,114, filed Aug. 31, 2005.

Hong, M., et al., "Epitaxial Cubic Gadolinium Oxide as a Dielectric for Gallium Arsenide Passivation", Science, 283(5409), (Mar. 1999), 1897-1900.

Horwitz, J S, et al., "Pulsed laser deposition as a materials research tool", Applied Surface Science, 127-29, (May, 1998), 507-513.

Hubbard, K. J., et al., "Thermodynamic stability of binary oxides in contact with silicon", Journal of Materials Research, 11(11), (Nov. 1996), 2757-2776.

Hwang, C.-Y., et al., "Characterization of Gallium Nitride Grown on (0001) Sapphire by Plasma-Enhanced Atomic Layer Epitaxy", Mat. Res. Soc. Symo. Proc. vol. 326, (1994), 347-352.

Ishii, Hiroyuki, "Growth and electrical properties of atomic-layer deposited ZrO2/Si-nitride stack gate dielectrics", Journal of Applied Physics, 95(2), (Jan. 15, 2004), 536-542.

Iyer, S. S., et al., "A Gate-Quality Dielectric System for SiGe Metal-Oxide-Semiconductor Devices", IEEE Electron Device Letters, vol. 12, No. 5, (May 1991), 246-248.

Jeon, T. S., "Thermal Stabilitiy of ultrathin ZrO2 films prpared by chemical vapor deposition of Si(100)", Appl. Phys. Lett., 78(3), (Jan. 15, 2001), 368-370.

Jeong, Chang-Wook, "Plasma-Assisted Atomic Layer Growth of High-Quality Aluminum Oxide Thin Films", Japanese Journal of Applied Physics, Part 1: Regular Papers and Short Notes and Review Papers, 40(1), (Jan. 2001), 285-289.

Jonsson, A. K., "Dielectric Permittivity and Intercalation Parameters of Li Ion Intercalated Atomic Layer Deposited ZrO2", Journal of the Electrochemical Society, vol. 151, No. 3, (2004), F54-F58.

Karam, N. H., et al., "Growth of device quality GaN at 550 degrees C by atomic layer epitaxy", Appl. Phys. Lett., 67(1), (Jul. 3, 1995), 94-96.

Khan, M. Asif, et al., "GaN/AlN digital alloy short-period superlattices by switched atomic layer metalorganic chemical vapor deposition", Appl. Phys. Lett., 63(25), (Dec. 20, 1993), 3470-3472.

Kim, C. T., "Application of Al2O3 Grown by Atomic Layer Deposition to DRAM and FeRAM", 12th International Symposium in Integrated Ferroelectrics, (Mar. 2000), p. 316.

Kim, Y, et al., "Substrate dependence on the optical properties of Al2O3 films grown by atomic layer deposition", Applied Physics Letters, 71(25), (Dec. 22, 1997), 3604-3606.

Kizilyalli, I. C., et al., "Stacked Gate Dielectrics with TaO for Future CMOS Technologies", Tech. Dig. of the VLSI Symposium, (1998), 216-217.

Kukli, Kaupo, "Low-Temperature Deposition of Zirconium Oxide-Based Nanocrystalline Films by Alternate Supply of Zr[OC(CH3)3]4 and H2O", Chemical Vapor Deposition, 6(6), (2000), 297-302.

Kwo, J., et al., "High E gate dielectrics Gd2O3 and Y2O3 for silicon", Applied Physics Letters, 77(1), (Jul. 3, 2000), 130-132.

Leskela, M, "ALD precursor chemistry: Evolution and future challenges", Journal de Physique IV (Proceedings), 9(8), (Sep. 1999), 837-852.

Leskela, M., "ALD precursor chemistry: Evolution and future challenges", J. Phys. IV France, 9, (1999), 837-852.

Liou, H. K., et al., "Effects of Ge concentration on SiGe oxidation behavior", Appl. Phys. Lett. 59(10), (Sep. 2, 1991), 1200-1202.

Lu, N, et al., "Higher K HfTaTiO gate dielectric with improved material and electrical characteristics", Device Research Conference Digest: Jun. 22, 2005, DRC '05. 63rd. pp. 221-222, (Jun. 22, 2005), 2 pgs.

Lu, N, et al., "Improved Device Performance and Reliability in High k HfTaTiO Gate Dielectric with TaN Gate Electrode", IEEE Electron Device Letters: 2005, vol. 26, No. 11, pp. 790.792, (Nov. 2005), 3 pgs.

Lu, Xu-Bing, et al., "Structure and dielectric properties of amorphous LaAlOsub3 and LaAlOsub x Nsub y films as alternative gate dielectric materials", Journal of Applied Physics, 94(2), (Jul. 15, 2003), 1229-1234.

Manchanda, L., et al., "Gate Quality Doped High K Films for CMOS Beyond 100 nm: 3-10nm Al2O3 with Low Leakage and Low Interface States", Tech. Dig. IEEE International Electron Devices Meeting, (1998), 605-608.

Meyerson, B S, "SiGe-Channel Heterojunction p-MOSFET's", IEEE Transactions on Electron Devices, 41(1), Authors: Verdonckt-Vandebroek, S.; Crabbe, E.F.; Meyerson, B.S.; Harame, D.L.; Restle, P.J.; Stork, J.M.C.; Johnson, J.B, (Jan. 1994), 90-101.

Muller, D. A., et al., "The electronic structure at the atomic scale of ultrathin gate oxides", Nature, 399, (Jun. 24, 1999), 758-61.

Nalwa, H. S, "Handbook of Thin Film Materials", Deposition and Processing of Thin Films, vol. 1, San Diego : Academic Press, (2002), 114-119.

Nam, Seok-Woo, "Study of ZrO2 thin films for gate oxide applications", Journal of Vacuum Science & Technology A: Vacuum, Surfaces, and Films, 19(4), (Jul. 2001), 1720-1724.

Nieh, R, et al., "Evaluation of Silicon Surface Nitridation Effects on Ultra-thin ZrO2 GateDielectrics", Applied Physics Letters, 81(9), (Aug. 26, 2002), 1663-1665.

Nieminen, Minna, et al., "Atomic layer epitaxy growth of LaGaO3 thin films", J. Mater Chem., vol. 11, (Nov. 2001), 3148-3153.

Nieminen, Minna, et al., "Growth of gallium oxide thin films from gallium acetylacetonate by atomic layer deposition", J. Mater. Chem., 6(1), (1996), 27-31.

Packan, Paul A, "Pushing the Limits", Science, 285(5436), (Sep. 1999), 2079-2081.

Paivasaari, Jani, et al., "A comparative study on lanthanide oxide thin films grown by atomic layer deposition", Thin Solid Films, 472(1-2), First available online in 2004, (Aug. 13, 2004), 275-281.

Pal, S., et al., "Gd2O2, Ga2O3(Gd2O3), Y2O3, and Ga2O3 as high-k gate dielectrics on SiGe: A comparative study", Journal of Applied Physics, vol. 90, No. 8, (Oct. 15, 2001), 4103-4107.

Passlack, M., et al., "Ga2O3 films for electronic and optoelectronic applications", J. Appl. Phys. 77(2), (Jan. 15, 1995), 686-693.

Passlack, M., et al., "Low Dit, Thermodynamically Stable Ga2O3-GaAs Interfaces: Fabrication, Characterization, and Modeling", IEEE Transactions on Electron Devices, vol. 44, No. 2, (Feb. 1997), 214-225.

Potter, Richard J., et al., "Deposition of HfO2, Gd2O3 and PrOx by Liquid Injection ALD Techniques", Chemical Vapor Deposition, 11(3), (2005), 159-169.

(56) References Cited

OTHER PUBLICATIONS

Puurunen, Riikka L, "Surface chemistry of atomic layer deposition: A case study for the trimethylaluminum/water process", J. Appl. Phys. 97, (2005), 121301 (52 pgs.).

Sakuma, Y., et al., "Comparative study of self-limiting growth of GaAs using different Ga-alkyl compounds: $(CH_3)_3Ga$, $C_2H_5(CH_3)_2Ga$, and $(C_2H_5)_3Ga$", J. Appl. Phys., 68(11), (Dec. 1, 1990), 5660-5664.

Shin, Chang Ho, "Fabrication and Characterization of MFISFET Using $Al_2O_3$ Insulating Layer for Non-volatile Memory", 12th International Symposium in Integrated Ferroelectrics, (Mar. 2000), 9 pages.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Somorjai, "Introduction to surface chemistry and catalysis", (1994), 336-337.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Wilk, G. D., et al., "Electrical Properties of hafnium silicate gate dielectrics deposited directly on silicon", Applied Physics Letters, vol. 74, No. 19, (May 10, 1999), 2854-2856.

Wilk, G. D., "High-K gate dielectrics: Current status and materials properties considerations", Journal of Applied Physics, 89(10), (May 2001), 5243-5275.

Wilk, G. D, "High-K gate dielectrics: Current status and materials properties considerations", Journal of Applied Physics, 89(10), (May 2001), 5243-5275.

Wilk, G. D., et al., "Stable zirconium silicate gate dielectrics deposited directly on silicon", Applied Physics Letters, vol. 76, No. 1, (Jan. 3, 1000), 112-114.

Youm, Minsoo, "Metal oxide semiconductor field effect transistor characteristics with iridium gate electrode on atomic layer deposited $ZrO_2$ high-k dielectrics", Jpn. J. Appl. Phys., vol. 42, (Aug. 2003), 5010-5013.

Yu, D. S., et al., "The Effect of $IrO_2$-$IrO_2$-Hf-$LaAlO_3$ Gate Dielectric on the Bias-Temperature Instability of 3-D GOI CMOSFETs", IEEE Electron Device Letters, vol. 26, No. 6, (Jun. 2005), 407-409.

Yu, Xiongfei, et al., "Advanced MOSFETs using HfTaON/SiO/sub 2/ gate dielectric and TaN metal gate with excellent performances for low standby power application", IEEE International Electron Devices Meeting, 2005. IEDM Technical Digest., (Dec. 2005), 27-30.

Zhu, J, et al., "Pulsed laser deposited ZrAlON films for high-k gate dielectric applications", Applied Physics A, 81, (Nov. 2005), 1167-1171.

Zhu, J, "Structure and dielectric properties of ultra-thin $ZrO_2$ films for high-k gate dielectric application prepared by pulsed laser deposition", Applied Physics A Materials Science & Processing, 78, (5), (2004), 741-744.

Zhu, J, et al., "Structure and dielectric properties of Zr Al O thin films prpared by pulsed laser deposition", Microelectronic Engineering, 66, (2003), 849-854.

\* cited by examiner

GALLIUM LATHANIDE OXIDE FILMS

PRIORITY APPLICATION

This application is a divisional of U.S. application Ser. No. 11/329,025, filed Jan. 10, 2006 now U.S. Pat. No. 7,972,974, which is incorporated herein by reference in its entirety.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon-based metal oxide semiconductor field effect transistors (MOSFETs) and variations thereof, which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

SUMMARY

The abovementioned problems are addressed by the present invention and will be understood by reading and studying the following specification. An embodiment for a method includes forming a gallium lanthanide oxide film using atomic layer deposition. Embodiments include structures for capacitors, transistors, memory devices, and electronic systems with a gallium lanthanide oxide film structured as one or more monolayers, and methods for forming such structures. These and other aspects, embodiments, advantages, and features will become apparent from the following description and the referenced drawings.

DETAILED DESCRIPTION

Figure 1:
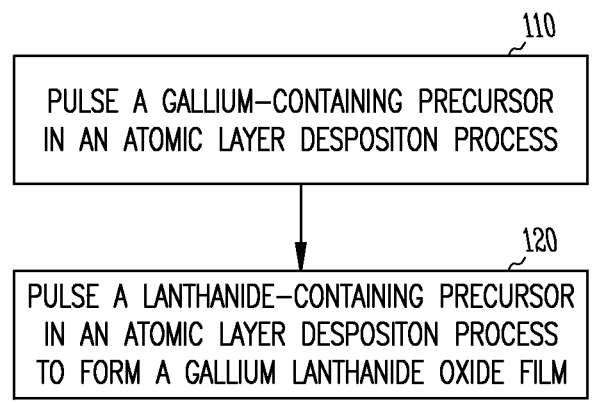
FIG. 1 illustrates features for an embodiment of a method to form a gallium lanthanide oxide film by atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include a semiconductor wafer. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

To scale a dielectric region to minimize feature sizes to provide high density electronic devices, the dielectric region should have a reduced equivalent oxide thickness ($t_{eq}$). The equivalent oxide thickness quantifies the electrical properties, such as capacitance, of a dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a silicon surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. This additional thickness may be eliminated by using a metal electrode, though such metal electrodes are not universally used for all devices. Thus, designs for future devices may be directed towards a physical $SiO_2$ dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$-Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers may not form a full band gap. The lack of a full band gap in a $SiO_2$ dielectric may cause an effective short between an underlying electrode and an overlying electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as one for a parallel plate capacitance: $C=\kappa\in_0 A/t$, where $\kappa$ is the dielectric constant, $\in_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternative dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for silicon-based devices. This may require that the dielectric material employed be grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having a high dielectric constant relative to $SiO_2$ also have a crystalline form, at least in a bulk configuration. The best candidates for replacing $SiO_2$ as a dielectric in a device are those that can be fabricated as a thin layer with an amorphous form and that have high dielectric constants.

In an embodiment, a film of gallium lanthanide oxide may be used as a dielectric layer for application in a variety of electronic devices, replacing the use of silicon oxide to provide a higher dielectric constant for the given dielectric layer. The gallium lanthanide oxide film may be formed as a combination of gallium oxide and lanthanide oxide. The gallium lanthanide oxide film may be formed as a composite of gallium, one or more lanthanides, and oxygen. The gallium lanthanide oxide film may be a gallium gadolinium oxide film. The gallium gadolinium oxide film may be formed as a combination of gallium oxide and gadolinium oxide. The gallium gadolinium oxide film may be formed as a composite of gallium, gadolinium, and oxygen.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a gallium lanthanide oxide dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited gallium lanthanide oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors may take the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming lanthanum oxide from a lanthanum tris[bis(trimethylsilyl)amide] precursor ($La(N(SiMe_3)_2)_3 = C_{18}H_{54}N_3LaSi_6$, where Me is an abbreviation for the methyl-group, $CH_3$) and water vapor, as its reactant precursor, forms an embodiment of a lanthanum/oxygen sequence, which can also be referred to as a lanthanum sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, water vapor is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface, depending on the particular precursor used. A cycle for such a metal-forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include processing a number of sequences for element A and a different number of sequences for element B. There may be cases in which ALD formation of an $ABO_x$ compound uses one precursor that contains the elements A and B, such that pulsing the AB-containing precursor followed by its reactant precursor onto a substrate may include a reaction that forms ABO$_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of gallium lanthanide oxide is formed on a substrate mounted in a reaction chamber using ALD in repetitive gadolinium and lanthanide sequences using precursor gases individually pulsed into the reaction chamber. Alternatively, solid or liquid precursors can be used in an appropriately designed reaction chamber.

In an embodiment, a gallium lanthanide oxide layer may be structured as one or more monolayers. A film of gallium lanthanide oxide, structured as one or more monolayers, may have a thickness that ranges from a monolayer to thousands of angstroms. The film may be processed using atomic layer deposition. Embodiments of an atomic layer deposited gallium lanthanide oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

The term gallium lanthanide oxide is used herein with respect to a material that essentially consists of gallium, the lanthanide, and oxygen in a form that may include a compound and/or a mixture of gallium oxide and lanthanide oxide. The lanthanide, represented by Ln, may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The gallium lanthanide oxide may be stoichiometric, non-stoichiometric, or a combination of stoichiometric and non-stoichiometric. In an embodiment, the gallium lanthanide oxide may be formed substantially as stoichiometric gallium lanthanide oxide. In an embodiment, the gallium lanthanide oxide may be formed substantially as a non-stoichiometric gallium lanthanide oxide. In an embodiment, the gallium lanthanide oxide may be formed substantially as a combination of non-stoichiometric gallium lanthanide oxide and stoichiometric gallium lanthanide oxide. Herein, a gallium lanthanide oxide compound may be expressed as GaLnO, GaLnO$_x$, Ga$_x$Ln$_y$O$_z$, or other equivalent forms. The expression GaLnO or its equivalent forms may be used to include a stoichiometric gallium lanthanide oxide. The expression GaLnO or its equivalent forms may be used to include a non-stoichiometric gallium lanthanide oxide. The expression GaLnO or its equivalent forms may be used to include a combination of a stoichiometric gallium lanthanide oxide and a non-stoichiometric gallium lanthanide oxide. In an embodiment, a gallium lanthanide oxide film may be structured as a mixture of gallium oxide and a lanthanide oxide, which may be represented by GaO$_x$(LnO$_y$). In an embodiment, a gallium gadolinium oxide film may be used in a variety of electronic devices and systems. The gallium gadolinium oxide film may be structured as a film of Ga$_2$O$_3$ (Gd$_2$O$_3$). The gallium gadolinium oxide film may be structured as a film of Ga$_3$Gd$_5$O$_{12}$. The expression LnO$_y$ may be used to include a stoichiometric lanthanide oxide. The expression LnO$_y$ may be used to include a non-stoichiometric lanthanide oxide. The expression LnO$_y$ may be used to include a combination of a stoichiometric lanthanide oxide and a non-stoichiometric lanthanide oxide. Expressions GaO$_x$ and GdO$_y$ may be used in the same manner as LnO$_y$. In various embodiments, a gallium lanthanide oxide film may be doped with elements or compounds other than the lanthanide, gallium, and oxygen.

In an embodiment, a GaLnO$_x$ film may be constructed as one or more monolayers by atomic layer deposition. Prior to forming the GaLnO$_x$ by ALD, the surface on which the GaLnO$_x$ is to be deposited may undergo a preparation stage. The surface may be the surface of a substrate for an integrated circuit. In an embodiment, the substrate used for forming a transistor includes a silicon or silicon-containing material. In other embodiments, germanium, silicon germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a substrate may undergo a final hydrofluoric (HF) rinse prior to ALD processing to provide the substrate with a hydrogen-terminated surface without a native oxide layer.

Cleaning immediately preceding atomic layer deposition aids in reducing an occurrence of silicon oxide as an interface between a silicon-based substrate and a gallium lanthanide oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a SiO$_2$ interface layer or other composition interface layer, may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a channel of a transistor; however, one skilled in the art will recognize that other semiconductor device structures may utilize this process.

FIG. 1 illustrates features of an embodiment of a method to form a gallium lanthanide oxide film by atomic layer deposition. The individual features labeled 110 and 120 may be performed in various orders. Between each pulsing of a precursor used in the atomic layer deposition process, a purging gas may be pulsed into the ALD reaction chamber. Between each pulsing of a precursor, the ALD reactor chamber may be evacuated using vacuum techniques as are known by those skilled in the art. Between each pulsing of a precursor, a purging gas may be pulsed into the ALD reaction chamber and the ALD reactor chamber may be evacuated.

At 110, a gallium-containing precursor may be pulsed onto a substrate in an ALD reaction chamber. A number of precursors containing gallium may be used to provide the gallium to the substrate. In an embodiment, a precursor containing gallium may include a gallium(acac)$_3$ (acac=pentane-2,4-dionate) precursor. Precursors used in the ALD formation of gallium compounds such as GaAs, GaN, and InGaN may be applied to provide gallium to a substrate. These precursors include triethylgallium (TEG) and trimethylgallium (TMG). A gallium-containing precursor may be pulsed to a silicon substrate having a specific orientation. In an embodiment, a gallium-containing precursor may be pulsed to a silicon (100) substrate. In an embodiment, a gallium-containing precursor may be pulsed to a silicon germanium layer. In an embodiment, a gallium-containing precursor may be pulsed to a silicon germanium substrate. In various embodiments, after pulsing the gallium-containing precursor and purging the reaction chamber of excess precursor and by-products from pulsing the precursor, a reactant precursor may be pulsed into the reaction chamber. The reactant precursor may be an oxygen reactant precursor. Ozone or water may be used as its reactant precursor in a gallium sequence. During a gallium sequence, the substrate may be held between about 350° C. and about 400° C. In various embodiments, use of the individual gallium-containing precursors is not limited to the temperature ranges of the above embodiments. In addition, the pulsing of the gallium precursor may use a pulsing period that provides uniform coverage of a monolayer on the surface or may use a pulsing period that provides partial coverage of a monolayer on the surface during a gallium sequence.

At 120, a lanthanide-containing precursor is pulsed onto a substrate in an ALD reaction chamber. A number of precursors containing a lanthanide may be used to provide the lanthanide to a substrate for an integrated circuit. The substrate may be a silicon substrate. In an embodiment, a lanthanide-containing precursor may be pulsed to a silicon germanium layer. In an embodiment, a lanthanide-containing precursor may be pulsed to a silicon germanium substrate. In an embodiment, a precursor containing a lanthanide may include Ln(thd)$_3$ (thd=2,2,6,6-tetramethyl-3,5-heptanedione). Ozone may be used as its reactant precursor in a lanthanide sequence. In an embodiment, the substrate temperature may be maintained at a temperature below about 650° C. In an embodiment, the substrate temperature may be maintained at about 300° C. In an embodiment, the atomic layer deposition chamber may be maintained at a pressure of about 2 to 3 mbar.

In an embodiment, a lanthanum-containing precursor is pulsed onto a substrate in an ALD reaction chamber. A number of precursors containing lanthanum may be used to provide lanthanum on a substrate for an integrated circuit. In an embodiment using a La(thd)$_3$ precursor, the substrate may be maintained at a temperature ranging from 180° C. to about 425° C. In an embodiment, the lanthanum-containing precursor may be La(N(SiMe$_3$)$_2$)$_3$. Water may be used as an oxygen reactant precursor for La(N(SiMe$_3$)$_2$)$_3$. The substrate may be maintained at temperatures ranging from about 200° C. to about 300° C. In an embodiment, the lanthanum-containing precursor may be tris (2,2,6,6-tetramethyl-3,5-heptanedionato)lanthanum (III) tetraglyme adduct. In an embodiment, the lanthanum-containing precursor may be trisethylcyclopentadionatolanthanum (La(EtCp)$_3$), where Et is an abbreviation for ethyl, CH$_2$CH$_3$, and Cp is an abbreviation for a cyclopentadienyl ligand having the formula C$_5$H$_5$. In an embodiment using a La(EtCp)$_3$ precursor, the substrate temperature may be maintained at a temperature ranging from about 400° C. to about 650° C. In an embodiment, the lanthanum-containing precursor may be trisdipyvaloylmethanatolanthanum (La(DPM)$_3$). In an embodiment, H$_2$ may be pulsed along with a La(EtCp)$_3$ precursor or a La(DPM)$_3$ precursor to reduce carbon contamination in the fabricated film.

In various embodiments, a gadolinium-containing precursor may be pulsed onto a substrate in an ALD reaction chamber. A number of precursors containing gadolinium may be used to provide gadolinium to the substrate for an integrated circuit. The gadolinium-containing precursor may be pulsed to a silicon substrate having a specific orientation. In an embodiment, a gadolinium-containing precursor may be pulsed to a silicon (100) substrate. In an embodiment, a gadolinium-containing precursor may be pulsed to a silicon germanium layer. In an embodiment, a gadolinium-containing precursor may be pulsed to a silicon germanium substrate. In an embodiment, the gadolinium-containing precursor may be Gd(thd)$_3$. The substrate may be maintained at a temperature ranging from 180° C. to about 425° C. In an embodiment, the substrate may be maintained at a temperature of about 300° C. The ALD chamber may be at pressure between about 2 mbar and 3 mbar.

In an embodiment, a gadolinium precursor may be used in a liquid injection atomic layer deposition process. In a liquid injection process, a precursor is dissolved in an inert solvent and held at room temperature until the precursor is pulsed into the reactant chamber during the ALD process. In an embodiment, a gadolinium-containing precursor for liquid injection atomic layer deposition includes Gd(OCMe$_2$CH$_2$OMe)$_3$. In an embodiment, a solution of Gd(OCMe$_2$CH$_2$OMe)$_3$ in toluene including tetraglyme, [CH$_3$O(CH$_2$CH$_2$O)$_4$CH$_3$], may be used for a liquid injection ALD process. In an embodiment for a liquid injection ALD process, the substrate may be maintained at a temperature of between about 200° C. and about 300° C. After pulsing the gadolinium-containing precursor and purging the reaction chamber of excess precursor and by-products from pulsing the precursor, a reactant precursor may be pulsed into the reaction chamber.

In various embodiments, after pulsing the lanthanide-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual lanthanide-containing precursors is not limited to the temperature ranges of the above embodiments. In addition, the pulsing of the lanthanide precursor may use a pulsing period that provides uniform coverage of a monolayer on the surface or may use a pulsing period that provides partial coverage of a monolayer on the surface during a lanthanide sequence.

An oxygen-containing precursor may be pulsed after a purge of the reaction chamber following each of the precursors providing a lanthanide and/or gallium for the formation of a layer of GaLnO. In an embodiment, an oxygen-containing precursor is pulsed after the precursors containing a lanthanide and gallium have been pulsed to provide a common oxygen reactant precursor. Various oxygen-containing precursors may be used as oxygen reactant precursors for each of a lanthanide sequence and a gallium sequence. In various embodiments, oxygen-containing precursors for the ALD formation of a GaLnO film may include, but are not limited to, one or more of water, atomic oxygen, molecular oxygen, ozone, hydrogen peroxide, a water-hydrogen peroxide mixture, alcohol, or nitrous oxide.

In various embodiments, nitrogen may be used as a purging gas and a carrier gas for one or more of the sequences used in the ALD formation of gallium lanthanide oxide. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques.

Excess precursor gas and reaction by-products may be removed by the purge gas and by evacuation of the reaction chamber.

Embodiments for methods for forming gallium lanthanide oxide film by atomic layer deposition may include numerous permutations of gallium sequences and lanthanide sequences for forming the gallium lanthanide oxide film. In an embodiment, a lanthanide sequence is conducted before a gallium sequence. In an embodiment, a gallium sequence is conducted before a lanthanide sequence. In an embodiment, a gallium/lanthanide cycle may include a number, x, of gallium sequences, and a number, y, of lanthanide sequences. The number of sequences x and y may be selected to engineer the relative amounts of lanthanide to gallium. In an embodiment, associated pulsing periods and times for the ALD sequences may be selected along with the number of sequences x and y to form an engineered gallium lanthanide oxide film.

The thickness of a gallium lanthanide oxide layer formed by atomic layer deposition may be determined by a fixed growth rate for the pulsing periods and precursors used, set at a value such as N nm/cycle, dependent upon the number of cycles of the gallium/lanthanide sequences. Once an ALD cycle is determined, a growth rate per cycle may be determined. As can be understood by those skilled in the art, particular growth rates can be determined during normal initial testing of the ALD system for processing a gallium lanthanide oxide dielectric film for a given application without undue experimentation. For a desired gallium lanthanide oxide layer thickness, t, in an application, the ALD process is repeated for t/N total cycles. Once the t/N cycles have completed, no further ALD processing for the gallium lanthanide oxide layer may be required.

After repeating a number of ALD cycles, a determination may be made as to whether the number of gallium/lanthanide cycles equals a predetermined number to form the desired gallium lanthanide oxide layer. If the total number of cycles to form the desired thickness has not been completed, a number of cycles for the gallium and lanthanide sequences may be repeated. If the total number of cycles to form the desired thickness has been completed, a dielectric film containing the gallium lanthanide oxide layer may optionally be annealed. The gallium lanthanide oxide layer processed at relatively low temperatures in an ALD process may provide an amorphous layer.

In an embodiment, a gallium lanthanide oxide film may be formed by fabricating layers of $GaO_x$ and $LnO_y$ by atomic layer deposition and annealing these layers to form the gallium lanthanide oxide film. The gallium lanthanide oxide film constructed in such a manner may be formed on a silicon structure, on a silicon germanium structure, on other semiconductor structures, or on insulator structures depending on the application. In an embodiment, a laminated stack of alternating layers of $GaO_x$ and $LnO_y$ are formed prior to annealing. In various embodiments, the order of forming $GaO_x$ and $LnO_y$ layers may be permutated. The annealing may be conducted in a nitrogen ambient. In an embodiment, annealing may be conducted in a nitrogen ambient having a small amount of oxygen. In an embodiment, annealing may be performed by rapid thermal annealing (RTA) to form a $GaLnO_x$ film. In an embodiment, a $GaGdO_x$ layer may be formed by atomic layer deposition and annealing. A $GaGdO_x$ layer may be structured as a film of $Ga_2O_3(Gd_2O_3)$. The gallium gadolinium oxide film may be structured as a film of $Ga_3Gd_5O_{12}$.

In an embodiment, a layer of gallium oxide and a layer of lanthanide oxide are each grown by atomic layer deposition to a thickness such that annealing these layers at appropriate temperatures may essentially convert these layers to a layer of gallium lanthanide oxide. In an embodiment, each layer of $GaO_x$ and $LnO_y$ may be formed to a thickness of 10 Å or less. In the various embodiments, the thickness of a gallium lanthanide oxide film is related to the number of ALD cycles performed and the growth rate associated with forming each layer of $GaO_x$ and $LnO_y$. In an embodiment, a GaLnO film may be grown to a desired thickness by repetition of a process including atomic layer deposition of layers of $GaO_x$ and $LnO_y$ followed by annealing. In an embodiment, a base thickness may be formed according to various embodiments such that forming a predetermined thickness of a GaLnO film may be conducted by forming a number of layers having the base thickness. As can be understood by one skilled in the art, determining the base thickness depends on the application and can be determined during initial processing without undue experimentation. Relative amounts of gallium and the lanthanide in a GaLnO film may be controlled by regulating the relative thicknesses of the individual layers of $GaO_x$ and $LnO_y$ formed. In addition, relative amounts of gallium and lanthanide in a GaLnO film may be controlled by forming a layer of GaLnO as multiple layers of different base thickness and by regulating the relative thicknesses of the individual layers of $GaO_x$ and $LnO_y$ formed in each base layer.

Atomic layer deposition of the individual components of the gallium lanthanide oxide film allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a $GaLnO_x$ film, each precursor may be pulsed into the reaction under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

Either before or after forming a gallium lanthanide oxide film, other dielectric layers such as nitride layers, dielectric metal silicates, insulating metal oxides including $GaO_x$, $GdO_y$, and other lanthanide oxides such as $LaO_y$, $PrO_y$, $NdO_y$, $SmO_y$, $DyO_y$, $CeO_y$, $TbO_y$, $ErO_y$, $EuO_y$, $LuO_y$, $TmO_y$, $HoO_y$, $PmO_y$, and $YbO_y$ or combinations thereof may be formed as part of a multi-layer dielectric or dielectric stack. These one or more other layers of dielectric material may be provided in stoichiometric form, in non-stoichiometric form, or a combination of stoichiometric dielectric material and non-stoichiometric dielectric material.

Depending on the application, a dielectric stack containing a gallium lanthanide oxide film may include a silicon oxide layer. In an embodiment, the dielectric layer may be formed as a nanolaminate. An embodiment of a nanolaminate may include a layer of $GdO_x$ and a layer of GaLnO, a layer of $LnO_y$, and a layer of GaLnO, layers of $GdO_x$ and $LnO_y$ along with a GaLnO film, or various other combinations. Alternatively, a dielectric layer may be formed substantially as the gallium lanthanide oxide film.

In various embodiments, the structure of an interface between a dielectric layer and a silicon substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In an embodiment, a dielectric layer containing a gallium lanthanide oxide layer may have a $t_{eq}$ ranging from about 5 Å to about 20 Å. In an embodiment, a dielectric layer containing a gallium lanthanide oxide layer may have a $t_{eq}$ of less than 5 Å. In an embodiment, a gallium lanthanide oxide film may be formed with a thickness ranging from a monolayer to thousands of angstroms. Further, dielectric films of gallium lanthanide oxide formed using atomic layer deposition may provide not only thin $t_{eq}$ films, but also films with relatively low leakage current. Additionally, embodiments may be implemented to form transistors, capacitors, memory devices, and other electronic systems including information handling devices.

In various embodiments, a gallium lanthanide oxide dielectric structure may replace conventional gate oxides in silicon-based transistors and in transistor structures based on more complex materials such as in strained SiGe-based heterostructures. Use of conventional gate oxides formed at elevated temperatures in strained SiGe-based heterostructure complementary metal-oxide-semiconductor (CMOS) structures may lead to strain relaxation and germanium segregation at the oxide-semiconductor interface. A gallium lanthanide oxide dielectric structure may be used in strained SiGe-based heterostructures to make use of enhanced hole mobility and compatibility of a strained SiGe material system with silicon. In an embodiment, a gallium lanthanide oxide film may be grown on an epitaxial layer of strained SiGe on silicon. In an embodiment, a gallium lanthanide oxide film may be grown on an epitaxial layer of silicon on an epitaxial layer of strained SiGe on a silicon-based substrate. In an embodiment, a gallium gadolinium oxide film may be grown on an epitaxial layer of strained SiGe on silicon. In an embodiment, a gallium lanthanide oxide film may be formed on a strained $Si_{0.74}Ge_{0.26}$ layer. In an embodiment, a $Ga_2O_3$ $(Gd_2O_3)$ may be grown on an epitaxial layer of strained SiGe on silicon. In an embodiment, a $Ga_2O_3(Gd_2O_3)$ may be grown on an epitaxial layer of silicon on an epitaxial layer of strained SiGe on a silicon-based substrate.

Figure 2:
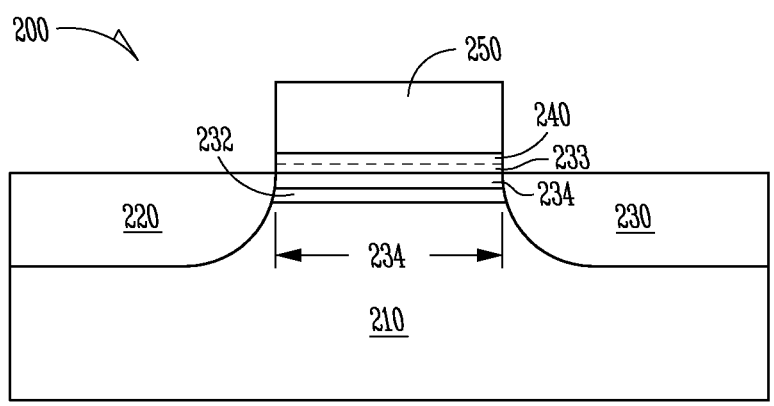
FIG. 2 shows an embodiment of a transistor having a dielectric layer containing a gallium lanthanide oxide film.

FIG. 2 shows an embodiment of a transistor 200 having a dielectric layer 240 containing a gallium lanthanide oxide film. In an embodiment, dielectric layer 240 includes a gallium gadolinium oxide film. In an embodiment, dielectric layer 240 includes a $Ga_2O_3(Gd_2O_3)$ film. In an embodiment, dielectric layer 240 includes a $Gd_3Ga_5O_{12}$ film. Transistor 200 may include a source region 220 and a drain region 230 in substrate 210, where source and drain regions 220, 230 are separated by a channel 232 having a channel length 234. In an embodiment, channel 232 may be structured as a silicon channel. In an embodiment, channel 232 may be structured as a silicon germanium channel. In an embodiment, channel 232 may be structured as an epitaxial layer of strained SiGe. In an embodiment, channel 232 may be structured as an epitaxial layer of strained SiGe on an epitaxial layer of silicon disposed on a silicon-based substrate 210. Channel 232 may be a p-type channel. Alternatively, channel 232 may be an n-type channel.

Gate dielectric 240 formed as a dielectric layer containing a gallium lanthanide oxide film may be disposed above channel 232. Gate dielectric 240 may be realized as a dielectric layer formed substantially of gallium lanthanide oxide. Gate dielectric 240 may be a dielectric stack containing at least one gallium lanthanide oxide film and one or more layers of insulating material other than the gallium lanthanide oxide film. The gallium lanthanide oxide film may be structured as one or more monolayers. An embodiment of a gallium lanthanide oxide film may be formed using atomic layer deposition. In an embodiment, a gate 250 may be formed over and contact gate dielectric 240.

In an embodiment, a semiconductor layer 234 may be formed on a silicon germanium channel 232 separating gate dielectric 240 and silicon germanium channel 232. Semiconductor layer 234 may have a thickness selected such that the operation of transistor 200 is based on the carrier mobility in silicon germanium channel 232. Semiconductor layer 234 may have a thickness constructed to be about one-half the thickness of silicon germanium channel 232. Semiconductor layer 234 may have a thickness constructed to be less than one-half the thickness of silicon germanium channel 232. In an embodiment, semiconductor layer 234 is a silicon layer.

An interfacial layer 233 may form between channel 232 and gate dielectric 240 or, in embodiments having semiconductor layer 234, between semiconductor layer 234 and gate dielectric layer 240. Interfacial layer 233 may be a silicon oxide layer, a silicate layer, or a combination of a silicon oxide and silicate layer. In an embodiment, interfacial layer 233 may be limited to a relatively small thickness compared to gate dielectric 240, or to a thickness significantly less than gate dielectric 240 as to be effectively eliminated.

Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 240 may be realized as a gate insulator in a silicon CMOS transistor. In an embodiment, gate dielectric 240 may be realized as a gate insulator in a silicon germanium CMOS transistor. Use of a gate dielectric containing gallium lanthanide oxide is not limited to silicon-based substrates, but may be used with a variety of semiconductor substrates.

Figure 3:
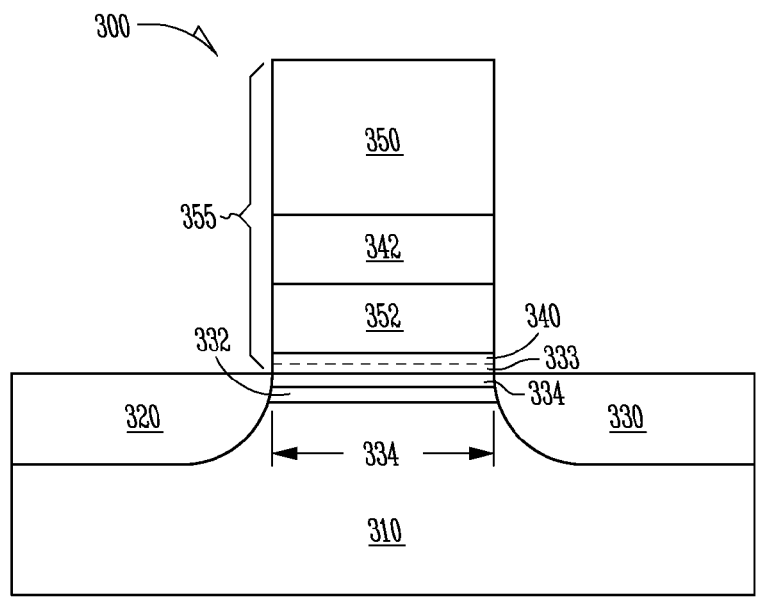
FIG. 3 shows an embodiment of a floating gate transistor having a dielectric layer containing a gallium lanthanide oxide film.

FIG. 3 shows an embodiment of a floating gate transistor 300 having a dielectric layer containing a gallium lanthanide oxide film. The gallium lanthanide oxide film may be structured as one or more monolayers. The gallium lanthanide oxide film may be formed using atomic layer deposition techniques. Transistor 300 may include a substrate 310 with a source 320 and a drain 330 separated by a channel 332 having a channel length 334. In an embodiment, channel 332 may be structured as a silicon channel. In an embodiment, channel 332 may be structured as a silicon germanium channel. In an embodiment, channel 332 may be structured as an epitaxial layer of strained SiGe. In an embodiment, channel 332 may be structured as an epitaxial layer of strained SiGe on an epitaxial layer of silicon disposed on a silicon-based substrate 310.

Located above channel 332 is a stack 355 including a gate dielectric 340, a floating gate 352, a floating gate dielectric 342, and a control gate 350. In an embodiment, gate dielectric 340 includes a dielectric containing a gallium lanthanide oxide film. In an embodiment, dielectric layer 340 includes a gallium gadolinium oxide film. In an embodiment, dielectric layer 340 includes a $Ga_2O_3(Gd_2O_3)$ film. In an embodiment, dielectric layer 340 includes a $Gd_3Ga_5O_{12}$ film. Gate dielectric 340 may be realized as a dielectric layer formed substantially of gallium lanthanide oxide. Gate dielectric 340 may be a dielectric stack containing at least one gallium lanthanide oxide film and one or more layers of insulating material other than the gallium lanthanide oxide. In an embodiment, floating gate 352 may be formed over and contact gate dielectric 340.

In an embodiment, a semiconductor layer 334 may be formed on a silicon germanium channel 332 separating gate dielectric 340 and silicon germanium channel 332. Semiconductor layer 334 may have a thickness selected such that the operation of transistor 300 is based on the carrier mobility in silicon germanium channel 332. Semiconductor layer 334 may have a thickness constructed to be about one-half the thickness of silicon germanium channel 332. Semiconductor layer 334 may have a thickness constructed to be less than one-half the thickness of silicon germanium channel 332. In an embodiment, semiconductor layer 334 is a silicon layer.

An interfacial layer 333 may form between channel 332 and gate dielectric 340 or, in embodiments having semiconductor layer 334, between semiconductor layer 334 and gate dielectric 340. In an embodiment, interfacial layer 333 may be limited to a relatively small thickness compared to gate dielectric 340, or to a thickness significantly less than gate dielectric 340 as to be effectively eliminated.

In an embodiment, floating gate dielectric 342 includes a dielectric containing a gallium lanthanide oxide film. In an embodiment, floating gate dielectric 342 includes a gallium gadolinium oxide film. In an embodiment, floating gate dielectric 342 includes a $Ga_2O_3(Gd_2O_3)$ film. In an embodiment, floating gate dielectric 342 includes a $Gd_3Ga_5O_{12}$ film. Floating gate dielectric 342 may be realized as a dielectric layer formed substantially of gallium lanthanide oxide. Floating gate dielectric 342 may be a dielectric stack containing at least one gallium lanthanide oxide film and one or more layers of insulating material other than the gallium lanthanide oxide. The gallium lanthanide oxide film may be structured as one or more monolayers. In an embodiment, the gallium lanthanide oxide film may be formed using atomic layer deposition techniques. In an embodiment, control gate 350 may be formed over and contact floating gate dielectric 342.

Alternatively, both gate dielectric 340 and floating gate dielectric 342 may be formed as dielectric layers containing a gallium lanthanide oxide film structured as one or more monolayers. Gate dielectric 340 and floating gate dielectric 342 may be realized by embodiments similar to those described herein, with the remaining elements of the transistor 300 formed using processes known to those skilled in the art. In an embodiment, gate dielectric 340 forms a tunnel gate insulator and floating gate dielectric 342 forms an inter-gate insulator in flash memory devices, where gate dielectric 340 and floating gate dielectric 342 may include a gallium lanthanide oxide film structured as one or more monolayers. Such structures are not limited to silicon-based substrates, but may be used with a variety of semiconductor substrates.

Figure 4:
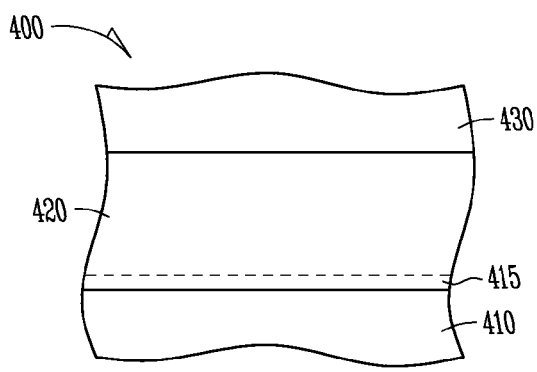
FIG. 4 shows an embodiment of a capacitor having a dielectric layer containing a gallium lanthanide oxide film.

Embodiments of a gallium lanthanide oxide film structured as one or more monolayers may also be applied to capacitors in various integrated circuits, memory devices, and electronic systems. In an embodiment for a capacitor 400 illustrated in FIG. 4, a method includes forming a first conductive layer 410, forming a dielectric layer 420 containing a gallium lanthanide oxide film structured as one or more monolayers on first conductive layer 410, and forming a second conductive layer 430 on dielectric layer 420. The gallium lanthanide oxide film of dielectric layer 420 may be formed using various embodiments described herein. Dielectric layer 420 may be realized as a dielectric layer formed substantially of gallium lanthanide oxide. Dielectric layer 420 may be a dielectric stack containing at least one gallium lanthanide oxide film and one or more layers of insulating material other than the gallium lanthanide oxide. In an embodiment, dielectric layer 420 includes a gallium gadolinium oxide film. In an embodiment, dielectric layer 420 includes a $Ga_2O_3(Gd_2O_3)$ film. In an embodiment, dielectric layer 420 includes a $Gd_3Ga_5O_{12}$ film. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

Embodiments for a gallium lanthanide oxide film structured as one or more monolayers may include, but are not limited to, a capacitor in a DRAM and capacitors in analog, radio frequency (RF), and mixed signal integrated circuits. Mixed signal integrated circuits are integrated circuits that may operate with digital and analog signals.

Figure 5:
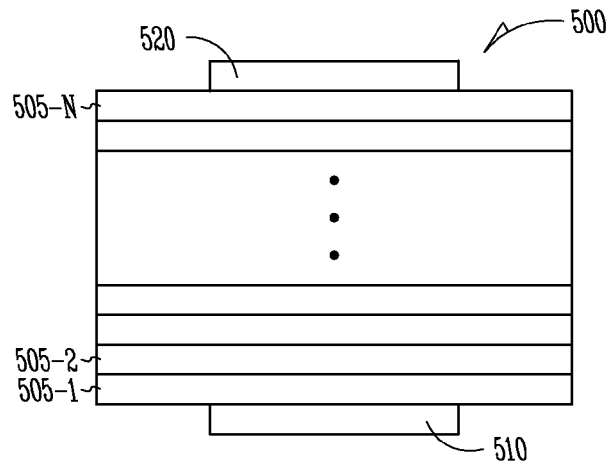
FIG. 5 depicts an embodiment of a dielectric layer having multiple layers including a gallium lanthanide oxide layer.

FIG. 5 depicts an embodiment of a dielectric structure 500 having multiple dielectric layers 505-1, 505-2, ... 505-N, in which at least one layer is a gallium lanthanide oxide layer. In an embodiment, each layer 505-1, 505-2 ... 505-N may be a gallium lanthanide oxide layer. Each gallium lanthanide oxide layer 505-1, 505-2 ... 505-N may be formed by atomic layer deposition. Layers 510 and 520 may provide means to contact dielectric layers 505-1, 505-2, ... 505-N. Layers 510 and 520 may be electrodes forming a capacitor. Layer 510 may be a channel of a transistor with layer 520 being a gate. Layer 510 may be a floating gate electrode with layer 520 being a control gate.

In an embodiment, dielectric structure 500 includes one or more layers of 505-1, 505-2, ... 505-N as dielectric layers other than a gallium lanthanide oxide layer, where at least one layer is a gallium lanthanide oxide layer. Dielectric layers 505-1, 505-2, ... 505-N may include a $GaO_x$ layer. Dielectric layers 505-1, 505-2, ... 505-N may include a $LnO_y$ layer. Dielectric layers 505-1, 505-2, ... 505-N may include a $GdO_y$ layer. Dielectric layers 505-1, 505-2 ... 505-N may include an insulating metal oxide layer, whose metal is selected to be a metal different from the lanthanides and gallium. Dielectric layers 505-1, 505-2 ... 505-N may include an insulating metal oxide layer, whose metal is selected to be a metal different from gadolinium and gallium. Dielectric layers 505-1, 505-2 ... 505-N may include an insulating nitride layer. Dielectric layers 505-1, 505-2 ... 505-N may include an insulating oxynitride layer. Dielectric layers 505-1, 505-2 ... 505-N may include a silicon nitride layer. Dielectric layers 505-1, 505-2 ... 505-N may include an insulating silicate layer. Dielectric layers 505-1, 505-2 ... 505-N may include a silicon oxide layer.

Various embodiments for a dielectric layer containing a gallium lanthanide oxide film structured as one or more monolayers may provide for enhanced device performance by providing devices with reduced leakage current. Such improvements in leakage current characteristics may be attained by forming one or more layers of a gallium lanthanide oxide in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $GaO_x$/GaLnO nanolaminate contains alternating layers of gallium oxide and GaLnO. In an embodiment, a $LnO_y$/GaLnO nanolaminate contains alternating layers of lanthanide oxide and GaLnO. In an embodiment, a $GdO_y$/GaLnO nanolaminate contains alternating layers of gadolinium oxide and GaLnO. In an embodiment, a $GaO_x$/

LnO$_y$/GaLnO nanolaminate contains various permutations of gallium oxide layers, lanthanide oxide layers, and gallium lanthanide oxide layers.

In an embodiment, dielectric structure 500 may be structured as a nanolaminate structure 500 including a gallium lanthanide oxide film structured as one or more monolayers. Nanolaminate structure 500 includes a plurality of layers 505-1, 505-2 . . . 505-N, where at least one layer contains a gallium lanthanide oxide film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 500 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 500 may be used as nanolaminate dielectrics in non-volatile read only memory (NROM) flash memory devices as well as other integrated circuits. In an embodiment, a layer of the nanolaminate structure 500 is used to store charge in the NROM device. The charge storage layer of a nanolaminate structure 500 in an NROM device may be a silicon oxide layer.

Transistors, capacitors, and other devices may include dielectric films containing a gallium lanthanide oxide layer structured as one or more monolayers. The gallium lanthanide oxide layer may be formed by atomic layer deposition. Dielectric films containing a gallium lanthanide oxide layer may be implemented into memory devices and electronic systems including information handling devices. Further, embodiments of electronic devices may be realized as integrated circuits. Embodiments of information handling devices may include wireless systems, telecommunication systems, and computers.

Figure 6:
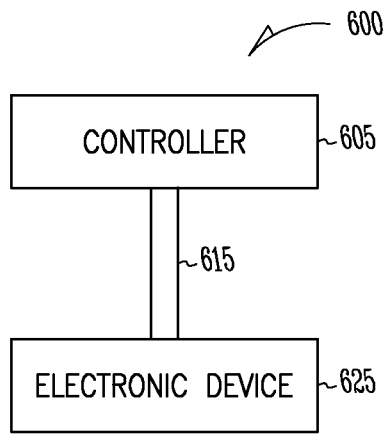
FIG. 6 is a simplified diagram for an embodiment of a controller coupled to an electronic device having a dielectric layer containing a gallium lanthanide oxide film.

FIG. 6 illustrates a block diagram for an electronic system 600 having one or more devices having a dielectric structure including a GaLnO film structured as one or more monolayers. Electronic system 600 includes a controller 605, a bus 615, and an electronic device 625, where bus 615 provides electrical conductivity between controller 605 and electronic device 625. In various embodiments, controller 605 may include an embodiment of a GaLnO film. In various embodiments, electronic device 625 may include an embodiment of a GaLnO film. In various embodiments, controller 605 and electronic device 625 may include embodiments of a GaLnO film. Electronic system 600 may include, but is not limited to, fiber optic systems, electro-optic systems, and information handling systems such as wireless systems, telecommunication systems, and computers.

Figure 7:
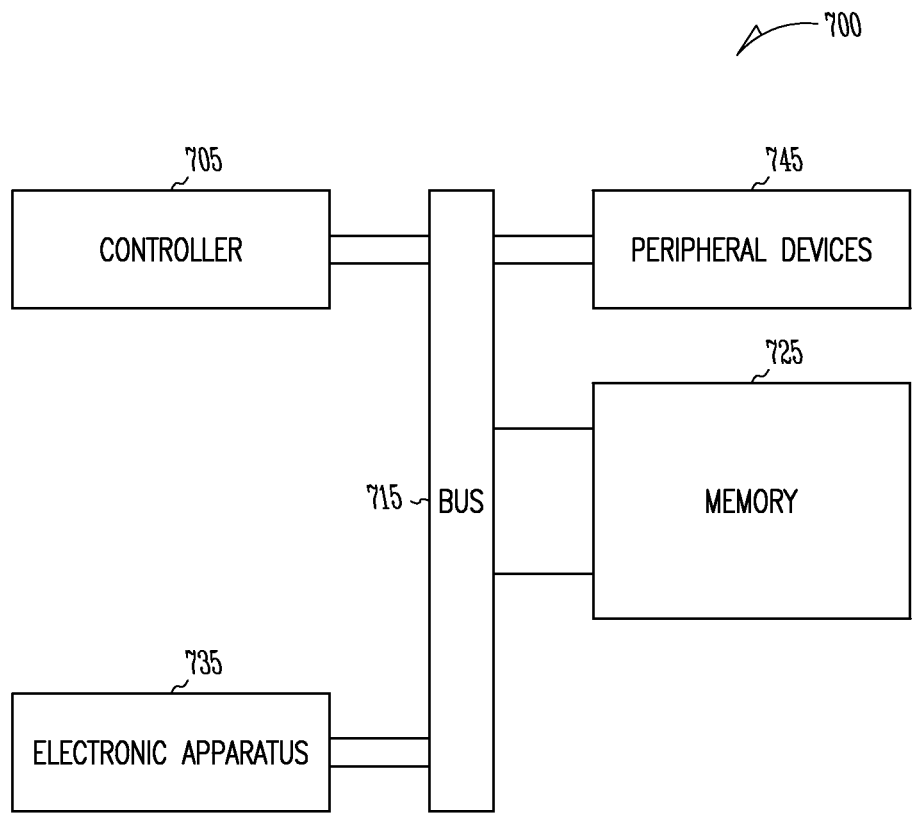
FIG. 7 illustrates a diagram for an embodiment of an electronic system having devices with a dielectric film containing a gallium lanthanide oxide film.

FIG. 7 depicts a diagram of an embodiment of a system 700 having a controller 705 and a memory 725. Controller 705 may include a GaLnO film structured as one or more monolayers. Memory 725 may include a GaLnO film structured as one or more monolayers. Controller 705 and memory 725 may include a GaLnO film structured as one or more monolayers. System 700 also includes an electronic apparatus 735 and a bus 715, where bus 715 provides electrical conductivity between controller 705 and electronic apparatus 735, and between controller 705 and memory 725. Bus 715 may include an address, a data bus, and a control bus, each independently configured. Alternatively, bus 715 may use common conductive lines for providing one or more of address, data, or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. One or more of controller 705, memory 725, bus 715, electronic apparatus 735, or peripheral devices 745 may include an embodiment of a dielectric layer having a GaLnO film structured as one or more monolayers. System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with memory 725 or controller 705 and memory 725.

Memory 725 may be realized as a memory device containing a GaLnO film structured as one or more monolayers. The GaLnO structure may be formed in a memory cell of a memory array. The GaLnO structure may be formed in a capacitor in a memory cell of a memory array. The GaLnO structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
   a substrate;
   a dielectric layer in an integrated circuit on the substrate, the dielectric layer containing a number of oxide films, including a gallium lanthanide oxide film, and a lanthanide oxide film, and an insulating metal oxide layer whose metal is different from lanthanides and gallium, the number of oxide films structured as monolayers; and
   a silicon oxide interface layer between the substrate and the dielectric layer.

2. The electronic device of claim 1, wherein the dielectric layer is disposed on a silicon germanium layer.

3. The electronic device of claim 2, wherein the silicon germanium layer includes a strained $Si_{0.74}Ge_{0.26}$ layer.

4. The electronic device of claim 1, wherein the dielectric layer is disposed on a silicon germanium layer with a silicon layer separating the dielectric layer from the silicon germanium layer.

5. The electronic device of claim 1, wherein the gallium lanthanide oxide film includes $GaO_x(LnO_y)$ layer.

6. The electronic device of claim 1, wherein the gallium lanthanide oxide film includes a $Ga_2O_3(Gd_2O_3)$ layer.

7. The electronic device of claim 1, wherein the gallium lanthanide oxide film includes a $Gd_3Ga_5O_{12}$ layer.

8. The electronic device of claim 1, wherein the gallium lanthanide oxide film includes a composite of gallium, gadolinium, and oxygen.

9. The electronic device of claim 1, wherein the gallium lanthanide oxide film includes the gallium lanthanide oxide film in a nanolaminate.

10. The electronic device of claim 1, wherein the electronic device includes a transistor having the dielectric layer as a gate insulator of the transistor.

11. The electronic device of claim 1, wherein the electronic device includes a silicon CMOS transistor having the dielectric layer as a gate insulator.

12. The electronic device of claim 1, wherein the electronic device includes a silicon germanium CMOS transistor having the dielectric layer as a gate insulator.

13. The electronic device of claim 1, wherein the electronic device includes a floating gate transistor having the dielectric layer as a floating gate insulator of the floating gate transistor.

14. The electronic device of claim 1, wherein the electronic device includes a memory having the dielectric layer configured as a nanolaminate in the memory.

15. The electronic device of claim 1, wherein the electronic device includes a conductive path to a conductive layer on and contacting the dielectric layer to provide a signal to the conductive layer to operate in an electronic system.

16. An electronic device comprising:
a source region and a drain region, separated by a channel;
a gate located over the channel;
a dielectric between the channel and the gate, the dielectric containing a number of oxide films, including a gallium lanthanide oxide film, and a lanthanide oxide film, and an insulating metal oxide layer whose metal is different from lanthanides and gallium, the number of oxide films structured as monolayers; and
a silicon oxide interface layer between the channel and the dielectric layer.

17. The electronic device of claim 16, wherein the channel includes epitaxial strained SiGe.

18. The electronic device of claim 16, wherein the channel includes epitaxial SiGe formed over a substrate.

19. The electronic device of claim 18, wherein the channel includes epitaxial silicon formed over the epitaxial SiGe.

20. The electronic device of claim 19, wherein the epitaxial silicon is less than half a thickness the epitaxial SiGe.

21. The electronic device of claim 20, further including an interfacial oxide between the epitaxial SiGe and the dielectric.

22. The electronic device of claim 16, wherein the channel is a p-type channel.

23. The electronic device of claim 16, wherein the channel is an n-type channel.

24. An electronic device comprising:
a source region and a drain region, separated by a channel;
a floating gate located over the channel;
a dielectric layer between the channel region and the floating gate, the dielectric layer containing a number of oxide films, including a gallium lanthanide oxide film, and a lanthanide oxide film, and an insulating metal oxide layer whose metal is different from lanthanides and gallium, the number of oxide films structured as monolayers;
a silicon oxide interface layer between the channel region and the dielectric layer;
a control gate; and
a floating gate dielectric between the control gate and the floating gate.

25. The electronic device of claim 24, wherein the channel is a silicon channel.

26. The electronic device of claim 24, wherein the channel is a SiGe channel.

27. The electronic device of claim 24, wherein the channel includes epitaxial strained SiGe.

* * * * *